United States Patent
Choi et al.

(10) Patent No.: US 9,564,581 B1
(45) Date of Patent: Feb. 7, 2017

(54) MAGNETORESISTIVE EFFECT DEVICES HAVING ENHANCED MAGNETIC ANISOTROPY

(71) Applicant: HGST Netherlands B.V., Amsterdam (NL)

(72) Inventors: Young-Suk Choi, Los Gatos, CA (US); Kurt Allan Rubin, San Jose, CA (US); Derek Stewart, Livermore, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/948,145

(22) Filed: Nov. 20, 2015

(51) Int. Cl.
    H01L 43/08  (2006.01)
    H01L 43/02  (2006.01)
    H01L 43/10  (2006.01)
    G11C 11/16  (2006.01)

(52) U.S. Cl.
    CPC ............ *H01L 43/08* (2013.01); *G11C 11/161* (2013.01); *H01L 43/02* (2013.01); *H01L 43/10* (2013.01)

(58) Field of Classification Search
    CPC .......... H01L 43/08; H01L 43/02; H01L 43/10; G11C 11/161
    See application file for complete search history.

(56) References Cited

U.S. PATENT DOCUMENTS

| | | | |
|---|---|---|---|
| 8,441,082 B2 | 5/2013 | Ohmori et al. | |
| 8,492,859 B2 | 7/2013 | Hu | |
| 8,680,632 B2 * | 3/2014 | Daibou | H01L 43/10 257/421 |
| 8,860,156 B2 | 10/2014 | Beach et al. | |
| 8,920,947 B2 | 12/2014 | Zhang et al. | |
| 8,921,961 B2 | 12/2014 | Kula et al. | |
| 8,946,834 B2 | 2/2015 | Wang et al. | |
| 8,982,614 B2 * | 3/2015 | Nagamine | H01L 43/12 257/421 |
| 2014/0264663 A1 | 9/2014 | Chen et al. | |
| 2015/0008547 A1 | 1/2015 | Pi et al. | |

OTHER PUBLICATIONS

H. Meng et al., "Annealing effects on CoFeB—MgO magnetic tunnel junctions with perpendicular anisotropy" AIP Journal of Physics (2015) <http://scitation.aip.org/content/aip/journal/jap/110/3/10.1063/1.3611426>.

D. Weller et al., "Orbital magnetic moments of Co in multilayers with perpendicular magnetic anisotropy", Phys. Rev. B, 49, 12888 (1994).

A. Hallel et al., "Anatomy of perpendicular magnetic anisotropy in Fe/MgO magnetic tunnel junctions: First-principles insight", Phys. Rev. B, 88, 184423 (2013).

(Continued)

*Primary Examiner* — William Coleman

(74) *Attorney, Agent, or Firm* — Patterson & Sheridan, LLP

(57) ABSTRACT

Embodiments of the present disclosure generally relate to memory devices having enhanced perpendicular magnetic anisotropy. The memory device includes a plurality of first leads, a plurality of second leads, and a plurality of memory cells having a plurality of magnetic layers and a tunneling barrier layer. An interfacial layer is incorporated in each memory cell between one of the magnetic layers and the tunneling barrier layer to enhance perpendicular magnetic anisotropy, while preserving high tunneling magnetoresistance.

16 Claims, 3 Drawing Sheets

(56) References Cited

OTHER PUBLICATIONS

Tao et al., Perpendicular magnetic anisotropy in Ta|Co40Fe40B20|MgAl2O4 structures and perpendicular CoFeB|MgAl2O4|CoFeB magnetic tunnel junction, Appl. Phys. Lett., 105, 102407 (2014).

Koo et al., "Interface perpendicular magnetic anisotropy in Fe/MgAl2O4 layered structures", Phys. Status Solidi RRL, 8, 441 (2014).

Lambert et al., "Quantifying perpendicular magnetic anisotropy at the Fe—MgO(001) interface", Appl. Phys. Lett., 102, 122410 (2013).

H. Sukegawa et al., "Enhanced tunnel magnetoresistance in a spinel oxide barrier with cation-site disorder", Phys. Rev. B, 86, 184401 (2012).

H. Sukegawa et al., "Tunnel magnetoresistance with improved bias voltage dependence in lattice-matched Fe/spinel MgAl 2 O 4 (001) junctions", Applied Physics Letters 96, 212505 (2010).

* cited by examiner

MAGNETORESISTIVE EFFECT DEVICES HAVING ENHANCED MAGNETIC ANISOTROPY

BACKGROUND OF THE DISCLOSURE

Field of the Disclosure

Embodiments of the present disclosure generally relate to magnetic memory devices having enhanced perpendicular magnetic anisotropy.

Description of the Related Art

Magnetic memory devices in which the magnetic moment is orientated approximately perpendicular to the magnetic layer can achieve smaller device dimensions and greater overall storage capacity than memory devices where the magnetic moment is orientated in the plane of the magnetic layer. In order to effectively operate, memory devices require thermal stability of the perpendicular magnetic moment orientation. Perpendicular magnetic anisotropy (PMA) is critical in maintaining the thermal stability of the data stored in magnetic memory devices. Traditionally, magnetic memory cells consist of a fixed magnetic reference layer, a tunneling layer, and a free magnetic layer. The magnetic moment of the fixed layer is typically pinned by an adjacent antiferromagnetic layer. As the magnetic magnetization direction of the free layer changes relative to the reference layer, this change is detectable as a change in electrical resistance of the device, known as the tunneling magnetoresistance (TMR). The interfaces with the tunneling layer, in some configurations (Fe/MgO/Fe or FeCo/MgO/FeCo), can provide some PMA for the memory cell. However, the presence of disorder and crystallinity mismatch at the interface of the ferromagnetic and tunneling layers can lead to reduced PMA and poor TMR. Furthermore, there is an interest towards the production of smaller memory devices so that higher storage capacity can be achieved. These smaller memory devices will require greater PMA in order to maintain thermal stability of the magnetic moments.

The addition of layers consisting of heavy nonmagnetic elements or layers, which increase the moment on the free layer, has been proposed to promote PMA. However, these additional layers increase the critical current necessary to flip the magnetization and result in decreased device performance and increased energy consumption during writing and erasing operations.

Therefore, there is a need in the art for a memory cell having enhanced perpendicular magnetic anisotropy.

SUMMARY OF THE DISCLOSURE

Embodiments of the present disclosure generally relate to memory devices having enhanced perpendicular magnetic anisotropy. The memory device includes a plurality of first leads, a plurality of second leads, and a plurality of memory cells that have a plurality of magnetic layers and a tunneling barrier layer. An interfacial layer is incorporated in each memory cell between one of the magnetic layers and the tunneling barrier layer to enhance perpendicular magnetic anisotropy, while preserving high tunneling magnetoresistance.

In one embodiment, a memory cell is disclosed. The memory cell includes a first magnetic layer, a tunneling barrier layer, a second magnetic layer and at least a first interfacial layer disposed on and in contact with the tunneling barrier layer.

In another embodiment, a memory device is disclosed. The memory device includes a plurality of first leads, a plurality of second leads and a plurality of memory cells disposed between the plurality of first leads and the plurality of second leads. Each memory cell of the plurality of memory cells includes a first magnetic layer, a tunneling barrier layer, a second magnetic layer and at least a first interfacial layer disposed on and in contact with the tunneling barrier layer.

In another embodiment, a memory device is disclosed. The memory device includes a plurality of first leads, a plurality of second leads and a plurality of memory cells disposed between the plurality of first leads and the plurality of second leads. Each memory cell of the plurality of memory cells includes a first ferromagnetic layer, an oxide barrier layer, a second ferromagnetic layer, a first interfacial layer comprising $MgAl_2O_4$ disposed on and in contact with the first ferromagnetic layer and the oxide barrier layer, and a second interfacial layer comprising $MgAl_2O_4$ disposed on and in contact with the second ferromagnetic layer and the oxide barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to memory devices having enhanced perpendicular magnetic anisotropy. The memory device includes a plurality of first leads, a plurality of second leads, and a plurality of memory cells having a plurality of magnetic layers and a tunneling barrier layer. An interfacial layer is incorporated in each memory cell between one of the magnetic layers and the oxide barrier layer to enhance perpendicular magnetic anisotropy, while preserving high tunneling magnetoresistance.

Figure 1:
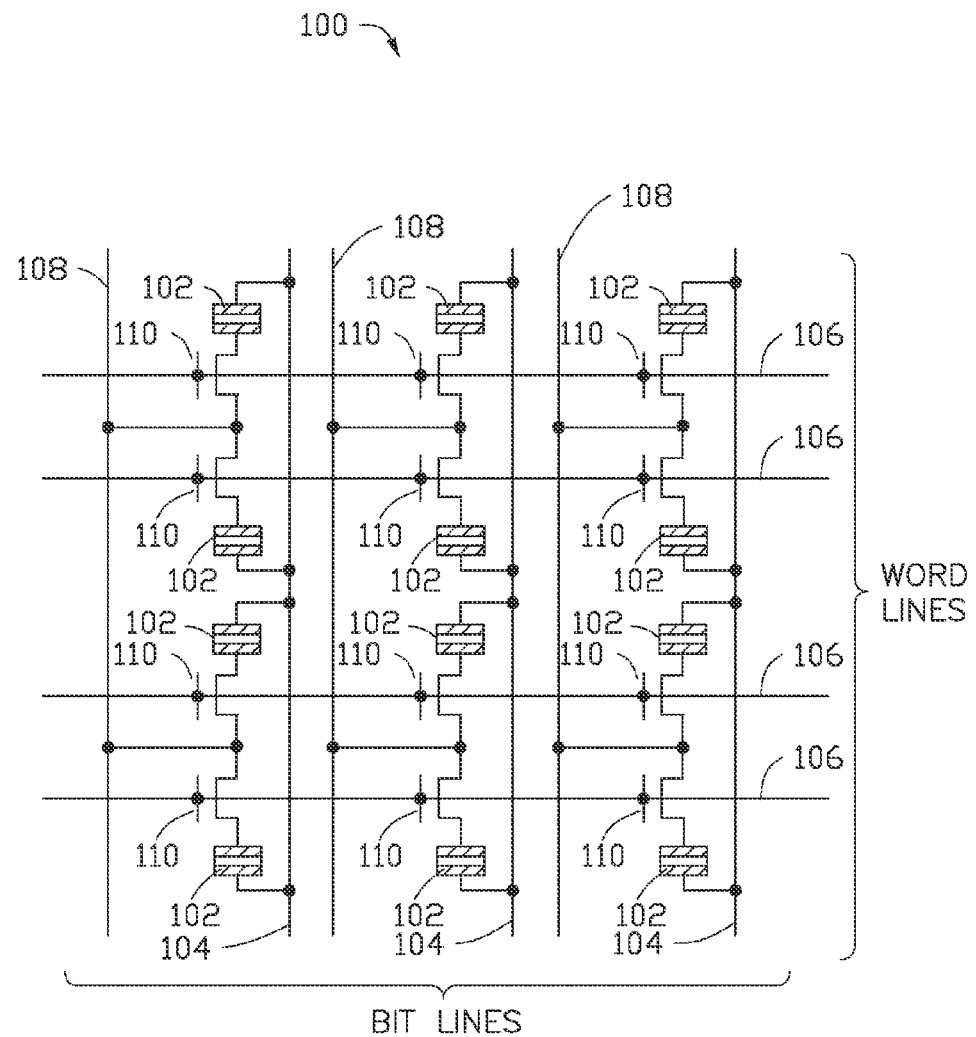
FIG. 1 is a schematic diagram of a STT-RAM memory array according to one embodiment described herein.

FIG. 1 is a schematic diagram of a STT-RAM memory array 100 according to one embodiment described herein. The STT-RAM memory array 100 may be a portion of a memory device. The STT-RAM memory array 100 may include a plurality of first leads 104, a plurality of second leads 106, a plurality of third leads 108, a plurality of memory cells 102, and a plurality of transistors 110. The plurality of first leads 104 may be substantially parallel among each other, the plurality of second leads 106 may be substantially parallel among each other, and each first lead 104 may be substantially perpendicular to each second lead 106. The plurality of third leads 108 may be substantially parallel among each other, and each third lead 108 may be substantially perpendicular to each second lead 106. The plurality of first leads 104 may be disposed over the plurality of second leads 106, and the plurality of second leads 106 may be disposed over the plurality of third leads 108. Each memory cell 102 may be disposed between a first lead 104 and a second lead 106. The plurality of first leads 104 may be bit lines, the plurality of second leads 106 may be word lines, and the plurality of third leads 108 may be source lines. In another embodiment, the plurality of first leads 104 may be word lines and the plurality of second leads 106 may be bit lines. Three first leads 104, four second leads 106, and three third leads 108 are illustrated in FIG. 1, but the STT-RAM memory array 100 may include more or less than three first leads 104, four second leads 106, and three third leads 108.

Figure 2:
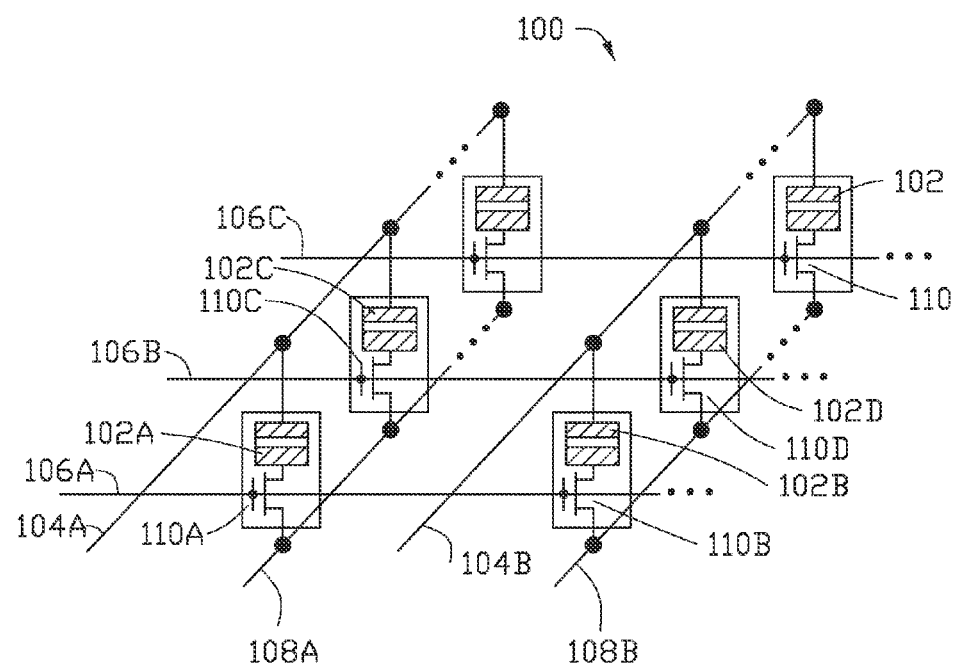
FIG. 2 is a schematic perspective view of the STT-RAM memory array according to one embodiment described herein.

FIG. 2 is a schematic perspective view of the STT-RAM memory array 100 according to one embodiment described herein. As shown in FIG. 2, the plurality of first leads 104 are disposed over the plurality of second leads 106, and the plurality of first leads 104 are substantially perpendicular to the plurality of second leads 106. The STT-RAM memory array 100 is arranged such that a first memory cell 102A is coupled to a first lead 104A of the plurality of first leads 104. The first memory cell 102A is also coupled to a first transistor 110A of the plurality of transistors 110. The first transistor 110A is coupled to a first lead 106A of the plurality of second leads 106 and a first lead 108A of the plurality of third leads 108. A second memory cell 102B is coupled to a second lead 104A of the plurality of first leads. The second memory cell 102B is also coupled to a second transistor 110B of the plurality of transistors 110. The second transistor 110B is coupled to the first lead 106A and a second lead 108B of the plurality of third leads 108. A third memory cell 102C is coupled to the first lead 104A of the plurality of first leads 104. The third memory cell 102C is also coupled to a third transistor 110C of the plurality of transistors 110. The third transistor 110C is coupled to a second lead 106B of the plurality of second leads 106 and the first lead 108A. A fourth memory cell 102D is coupled to the second lead 104B. The fourth memory cell 102D is also coupled to a fourth transistor 110D of the plurality of transistors 110. The fourth transistor 110B is coupled to the second lead 106B and the second lead 108B.

As shown in FIG. 2, the plurality of first leads 104 each have a longitudinal axis that extends substantially parallel to one another. The plurality of second leads 106 each also have longitudinal axis that extends substantially parallel to one another. The plurality of third leads 108 each also have a longitudinal axis that extends substantially parallel to one another. The longitudinal axes of the plurality of first leads 104 and plurality of third leads 108 is substantially perpendicular to the longitudinal axis of the plurality of second leads 106. The longitudinal axis of each of the memory cells 102 is perpendicular to both the plurality of first leads 104 and the plurality of second leads 106. Additionally, the plurality of first leads 104, the plurality of second leads 106, and the plurality of third leads 108 are disposed in different planes with the memory cells 102 and transistors 110 coupling the leads 104, 106, and 108 together.

Figure 3:
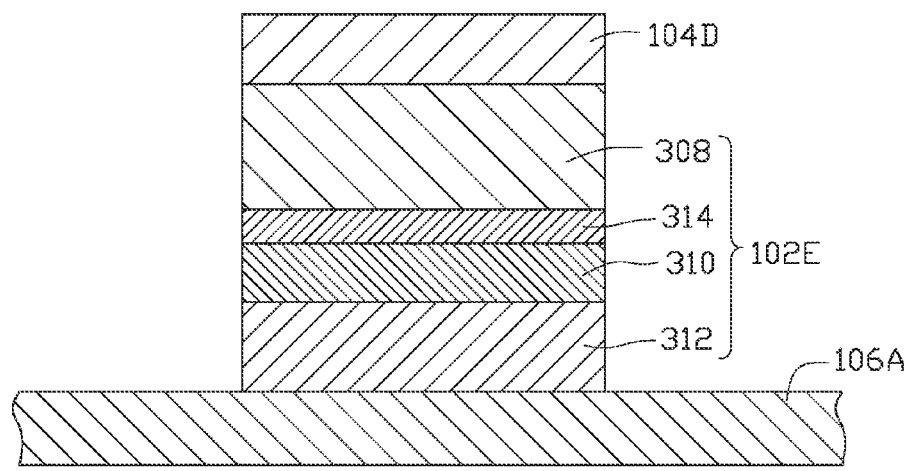
FIG. 3 is a cross sectional side view of a first lead, a second lead and the memory cell, according to one embodiment described herein.

FIG. 3 is a cross sectional side view of the fourth lead 104D of the plurality of first leads 104, the first lead 106A of the plurality of second leads 106 and a memory cell 102E of the plurality of memory cells 102, according to one embodiment described herein. As shown in FIG. 3, the memory cell 102E may be disposed on and in contact with the first lead 106A, and the fourth lead 104D may be disposed on and in contact with the memory cell 102E. In another embodiment, the memory cell 102E may be coupled to a transistor which is in contact with the first lead 106A. The memory cell 102E may include a first magnetic layer 308, a tunneling barrier layer 310, a second magnetic layer 312, and a first interfacial layer 314. The first interfacial layer 314 may be disposed on and in contact with the tunneling barrier layer 310 and the first magnetic layer 308 such that the first interfacial layer 314 is disposed between the first magnetic layer 308 and the tunneling barrier layer 310.

The first magnetic layer 308 and second magnetic layer 312 may be made of a ferromagnetic material, such as Fe, Ni, Co, an alloy of a ferromagnetic material, such as FeCo or FeCoB, or a Heusler alloy, including but not limited to $Co_2FeSi$, $Co_2FeGe$, $Co_2Fe_xMn_yGe$, or $Co_2Fe_xMn_ySi$. In one embodiment, the first magnetic layer 308 is a ferromagnetic free layer. In another embodiment, the first magnetic layer 308 is a ferromagnetic reference layer. In one embodiment, the second magnetic layer 312 is a ferromagnetic free layer. In another embodiment, the second magnetic layer 312 is a ferromagnetic reference layer. The tunneling barrier layer 310 may be made of an insulating or a semiconducting material. In one embodiment, the tunneling barrier layer 310 comprises an oxide. In one embodiment, the tunneling barrier layer 310 comprises MgO. In another embodiment, the tunneling barrier layer 310 comprises $Al_2O_3$. In another embodiment, the tunneling barrier layer 310 comprises an alkali halide such as NaCl. In another embodiment, the tunneling barrier layer 310 comprises AgCl. In another embodiment, the tunneling barrier layer 410 comprises ZnSe. The first interfacial layer 314 may be made of a material which enhances PMA. In one embodiment, the first interfacial layer 314 comprises $MgAl_2O_4$. In another embodiment, the first interfacial layer 314 comprises a non-stoichiometric $MgAl_xO_y$, where the oxygen content is slightly less than that found in the stoichiometric $MgAl_2O_4$. In another embodiment, the first interfacial layer 314 comprises a metal oxide. In another embodiment, the first interfacial layer 314 comprises a spinel oxide. In yet another embodiment, the first interfacial layer 314 comprises a material having a crystal lattice similar to that of the tunneling barrier layer 310. In other words, the first interfacial layer 314 comprises a material that has lower or comparable lattice mismatch percentage of about 0% to about 5%. In one embodiment, the first interfacial layer 314 comprises a material that has a lower lattice mismatch percentage than 3.7%, which is the lattice mismatch between Fe and MgO. In one embodiment, the first interfacial layer 314 has a thickness of about 1 to about 5 atomic layers. In a particular embodiment, the first interfacial layer 314 has a thickness of about 3 atomic layers.

For the case of oxide layers next to magnetic layers, enhanced perpendicular magnetic anisotropy can be achieved through well lattice matched oxides, where the oxygen atoms are situated above the neighboring magnetic atoms (e.g. Fe). This bonding configuration results in enhanced PMA. The oxide should also have a good lattice match with MgO to maintain a high TMR.

In use, the first interfacial layer 314 interacts with a magnetic layer, in this figure, the first magnetic layer 308, and the tunneling barrier layer 310 interact in such a way that the memory cell achieves an enhanced PMA. More specifically, the first interfacial layer 314 modifies the Fe bonds at the interface and affects the electronic structure within the first 4-5 atomic layers of the first magnetic layer 308 resulting in an increased PMA while the memory cell maintains a high TMR. The same is true of the first interfacial layers 414 and 514, and the second interfacial layer 516 described in FIGS. 4 and 5 below. Fe/MgAl$_2$O$_4$ and FeCo/MgAl$_2$O$_4$ interfaces possess high interfacial perpendicular magnetic anisotropy, due to Fe—O bonding perpendicular to the interface. The PMA of MgAl$_2$O$_4$ is comparable or greater than that at Fe/MgO interfaces. Magnetic tunnel junctions that use MgAl$_2$O$_4$ as a tunneling barrier have also demonstrated high TMR values. As one particular embodiment, since MgAl$_2$O$_4$ has a small lattice mismatch with both Fe and MgO, MgAl$_2$O$_4$ can be used as interfacial layer that enhances PMA while preserving high TMR.

Figure 4:
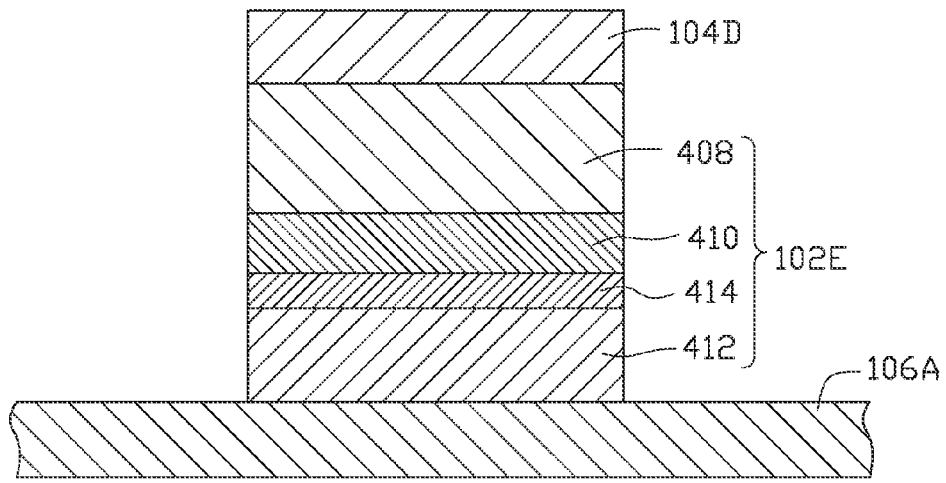
FIG. 4 is a cross sectional side view of a first lead, a second lead and the memory cell, according to another embodiment described herein.

FIG. 4 is a cross sectional side view of the fourth lead 104D of the plurality of first leads 104, the first lead 106A of the plurality of second leads 106 and a memory cell 102E of the plurality of memory cells 102, according to another embodiment described herein. The memory cell 102E may be disposed on and in contact with the first lead 106A, and the fourth lead 104D may be disposed on and in contact with the memory cell 102E. In another embodiment, the memory cell 102E may be coupled to a transistor which is in contact with the first lead 106A. The memory cell 102E may include a first magnetic layer 408, a tunneling barrier layer 410, a second magnetic layer 412, and a first interfacial layer 414. The first interfacial layer 414 may be disposed on and in contact with the tunneling barrier layer 410 and the second magnetic layer 412 such that the first interfacial layer 414 is disposed between the tunneling barrier layer 410 and the second magnetic layer 412.

The first magnetic layer 408 and second magnetic layer 412 may be made of a ferromagnetic material, such as Fe, Ni, Co, or an alloy of a ferromagnetic material, such as FeCo or FeCoB, or a Heusler alloy, including but not limited to Co$_2$FeSi, Co$_2$FeGe, Co$_2$Fe$_x$Mn$_y$Ge, or Co$_2$Fe$_x$Mn$_y$Si. In one embodiment, the first magnetic layer 408 is a ferromagnetic free layer. In another embodiment, the first magnetic layer 408 is a ferromagnetic reference layer. In one embodiment, the second magnetic layer 412 is a ferromagnetic reference layer. In another embodiment, the second magnetic layer 412 is a ferromagnetic free layer. The tunneling barrier layer 410 may be made of an insulating or a semiconducting material. In one embodiment, the tunneling barrier layer 410 comprises an oxide. In one embodiment, the tunneling barrier layer 410 comprises MgO. In another embodiment, the tunneling barrier layer 410 comprises Al$_2$O$_3$. In another embodiment, the tunneling barrier layer 410 comprises an alkali halide such as NaCl. In another embodiment, the tunneling barrier layer 410 comprises AgCl. In another embodiment, the tunneling barrier layer 410 comprises ZnSe. The first interfacial layer 414 may be made of a material which enhances PMA. In one embodiment, the first interfacial layer 414 comprises MgAl$_2$O$_4$. In another embodiment, the first interfacial layer 414 comprises a non-stoichiometric MgAl$_x$O$_y$, where the oxygen content is slightly less than that found in the stoichiometric MgAl$_2$O$_4$. In another embodiment, the first interfacial layer 414 comprises a metal oxide. In another embodiment, the first interfacial layer 414 comprises a spinel oxide. In yet another embodiment, the first interfacial layer 414 comprises a material having a crystal lattice similar to that of the tunneling barrier layer 410. In other words, the first interfacial layer 414 comprises a material that has lower or comparable lattice mismatch percentage of about 0% to about 5%. In one embodiment, the first interfacial layer 414 comprises a material that has a lower lattice mismatch percentage than 3.7%, which is the lattice mismatch between Fe and MgO. In one embodiment, the first interfacial layer 414 has a thickness of about 1 to about 5 atomic layers. In a particular embodiment, the first interfacial layer 414 has a thickness of about 3 atomic layers.

Figure 5:
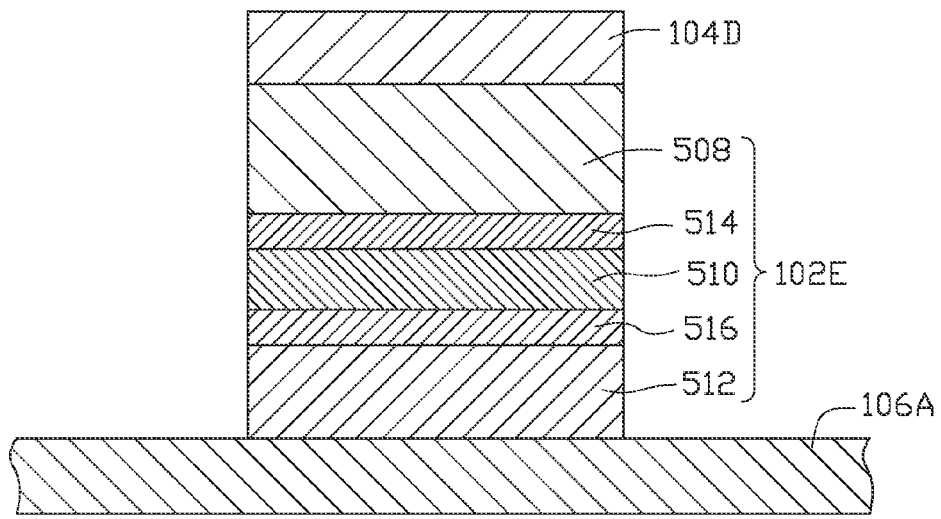
FIG. 5 is a cross sectional side view of a first lead, a second lead and the memory cell, according to another embodiment described herein.

FIG. 5 is a cross sectional side view of the fourth lead 104D of the plurality of first leads 104, the first lead 106A of the plurality of second leads 106 and a memory cell 102E of the plurality of memory cells 102, according to another embodiment described herein. The memory cell 102E may be disposed on and in contact with the first lead 106A, and the fourth lead 104D may be disposed on and in contact with the memory cell 102E. In another embodiment, the memory cell 102E may be coupled to a transistor which is in contact with the first lead 106A. The memory cell 102E may include a first magnetic layer 508, a tunneling barrier layer 510, a second magnetic layer 512, a first interfacial layer 514, and a second interfacial layer 516. The first interfacial layer 514 may be disposed on and in contact with the tunneling barrier layer 510 and the first magnetic layer 508, and the second interfacial layer 516 may be disposed on and in contact with the tunneling barrier layer 510 and the second magnetic layer 512. The first interfacial layer 514 is disposed between the tunneling barrier layer 510 and the first magnetic layer 508, and the second interfacial layer 516 is disposed between the tunneling barrier layer 510 and the second magnetic layer 512.

The first magnetic layer 508 and second magnetic layer 512 may be made of a ferromagnetic material, such as Fe, Ni, Co, or an alloy of a ferromagnetic material, such as FeCo or FeCoB, or a Heusler alloy, including but not limited to Co$_2$FeSi, Co$_2$FeGe, Co$_2$Fe$_x$Mn$_y$Ge, or Co$_2$Fe$_x$Mn$_y$Si. In one embodiment, the first magnetic layer 508 is a ferromagnetic free layer. In another embodiment, the first magnetic layer 508 is a ferromagnetic reference layer. In one embodiment, the second magnetic layer 512 is a ferromagnetic free layer. In another embodiment, the second magnetic layer 512 is a ferromagnetic reference layer. The tunneling barrier layer 510 may be made of an insulating or a semiconducting material. In one embodiment, the tunneling barrier layer 510 comprises an oxide. In one embodiment, the tunneling barrier layer 510 comprises MgO. In another embodiment, the tunneling barrier layer 510 comprises $Al_2O_3$. In another embodiment, the tunneling barrier layer 510 comprises an alkali halide such as NaCl. In another embodiment, the tunneling barrier layer 510 comprises AgCl. In another embodiment, the tunneling barrier layer 510 comprises ZnSe. The first interfacial layer 514 and second interfacial layer 516 may be made of a material which enhances PMA. In one embodiment, the first interfacial layer 514 and second interfacial layer 516 comprise $MgAl_2O_4$. In another embodiment, the first interfacial layer 514 and second interfacial layer 516 comprise a non-stoichiometric $MgAl_xO_y$, where the oxygen content is slightly less than that found in the stoichiometric $MgAl_2O_4$. In another embodiment, the first interfacial layer 514 and second interfacial layer 516 comprise a metal oxide. In another embodiment, the first interfacial layer 514 and second interfacial layer 516 comprise a spinel oxide. In yet another embodiment, the first interfacial layer 514 and second interfacial layer 516 comprise a material having a crystal lattice similar to that of the tunneling barrier layer 510. In other words, the first interfacial layer 514 and second interfacial layer 516 comprise a material that has lower or comparable lattice mismatch percentage of about 0% to about 5%. In one embodiment, the first interfacial layer 514 and second interfacial layer 516 comprise a material has a lower mismatch percentage than about 3.7%, which is the lattice mismatch between Fe and MgO. In one embodiment, the first interfacial layer 514 and second interfacial layer 516 each have a thickness of about 1 to about 5 atomic layers. In a particular embodiment, the first interfacial layer 514 and second interfacial layer 516 have a thickness of about 3 atomic layers.

In one embodiment, the first interfacial layer 514 and the second interfacial layer 516 are substantially identical in composition, thickness and volume. In another embodiment, the first interfacial layer 514 and the second interfacial layer 516 are different in at least one of composition, thickness and volume. For example the first interfacial layer 514 may be thicker than the second interfacial layer 516. Alternatively, the second interfacial layer 516 may be thicker than the first interfacial layer 514.

The first interfacial layers 314, 414, and 514, and second interfacial layer 516 interact with both the tunneling barrier layer 310, 410, or 510, and the first magnetic layer 308, 408, or 508, or the second magnetic layer 312, 412, or 512 in such a way the memory cell attains an increased PMA. These enhanced memory cells have greater device performance and may be used as part of memory devices having smaller dimensions.

In summary, a memory device including a memory cell is disclosed. The memory device includes a plurality of first leads, a plurality of second leads, and a plurality of memory cells. Each memory cell includes a first magnetic layer, a tunneling barrier layer, a second magnetic layer, and at least a first interfacial layer. The interfacial layer results in an enhanced perpendicular magnetic anisotropy, while preserving tunnel magnetoresistance.

While the description herein has made reference to a spin-transfer torque MRAM memory cell, it is to be understood that the disclosures herein are applicable to other memory cells as well such as spin hall assisted STT-MRAM, spin-hall MRAM, voltage controlled MRAM and thermally assisted MRAM. Additionally, the embodiments disclosed herein are also applicable to general magnetic sensors as well as magnetic read heads.

While the foregoing is directed to embodiments of the present disclosure, other and further embodiments of the disclosure may be devised without departing from the basic scope thereof, and the scope thereof is determined by the claims that follow.

What is claimed is:

1. A memory cell, comprising:
   a first magnetic layer;
   a tunneling barrier layer;
   a second magnetic layer; and
   at least a first interfacial layer disposed on and in contact with the tunneling barrier layer, wherein the first interfacial layer comprises $MgAl_2O_4$ or a non-stoichiometric $MgAl_xO_y$, where the oxygen content is slightly less than that found in the stoichiometric $MgAl_2O_4$.

2. The memory cell of claim 1, wherein the first interfacial layer is disposed on and in contact with the first magnetic layer.

3. The memory cell of claim 1, wherein the first interfacial layer is disposed on and in contact with the second magnetic layer.

4. The memory cell of claim 1, wherein the first interfacial layer has a thickness of about 1 to about 5 atomic layers.

5. The memory cell of claim 1, further comprising a second interfacial layer disposed on and in contact with the tunneling barrier layer.

6. A memory device, comprising:
   a plurality of first leads;
   a plurality of second leads; and
   a plurality of memory cells disposed between the plurality of first leads and the plurality of second leads, wherein each memory cell of the plurality of memory cells, comprises:
      a first magnetic layer;
      a tunneling barrier layer;
      a second magnetic layer; and
      at least a first interfacial layer disposed on and in contact with the tunneling barrier layer, wherein the first interfacial layer comprises $MgAl_2O_4$ or a non-stoichiometric $MgAl_xO_y$, where the oxygen content is slightly less than that found in the stoichiometric $MgAl_2O_4$.

7. The memory device of claim 6, wherein the first interfacial layer is disposed on and in contact with the first magnetic layer.

8. The memory device of claim 6, wherein the first interfacial layer is disposed on and in contact with the second magnetic layer.

9. The memory device of claim 6, wherein the first interfacial layer has a thickness of about 1 to about 5 atomic layers.

10. The memory device of claim 6, further comprising a second interfacial layer disposed on and in contact with the tunneling barrier layer.

11. The memory device of claim 10, wherein the first interfacial layer is disposed on and in contact with the first magnetic layer and the second interfacial layer is disposed on and in contact with the second magnetic layer.

12. A memory device, comprising:
   a plurality of first leads;
   a plurality of second leads; and
   a plurality of memory cells disposed between the plurality of first leads and the plurality of second leads, wherein each memory cell of the plurality of memory cells, comprises:
      a first magnetic layer;
      a tunneling barrier layer;
      a second magnetic layer;
      at least a first interfacial layer disposed on and in contact with the tunneling barrier layer; and a second interfacial layer disposed on and in contact with the tunneling barrier layer, wherein the first interfacial layer is disposed on and in contact with the first magnetic layer and the second interfacial layer is disposed on and in contact with the second magnetic layer, wherein the first and second interfacial layers comprise $MgAl_2O_4$.

13. A memory device, comprising:
a plurality of first leads;
a plurality of second leads; and
a plurality of memory cells disposed between the plurality of first leads and the plurality of second leads, wherein each memory cell of the plurality of memory cells, comprises:
  a first ferromagnetic layer;
  an oxide barrier layer;
  a second ferromagnetic layer;
  a first interfacial layer comprising $MgAl_2O_4$ disposed on and in contact with the first ferromagnetic layer and the oxide barrier layer; and
  a second interfacial layer comprising $MgAl_2O_4$ disposed on and in contact with the second ferromagnetic layer and the oxide barrier layer.

14. The memory device of claim 13, wherein the plurality of first leads are disposed over the plurality of second leads, and the plurality of first leads are perpendicular to the plurality of second leads.

15. The memory device of claim 14, wherein each memory cell of the plurality of memory cells is coupled to a lead of the plurality of first leads and a lead of the plurality of second leads.

16. The memory device of claim 15, wherein the first ferromagnetic layer is disposed on and in contact with a lead of the plurality of first leads and the second ferromagnetic layer is disposed on and in contact with a lead of the plurality of second leads.

* * * * *